United States Patent
Liu et al.

(10) Patent No.: US 11,677,011 B2
(45) Date of Patent: Jun. 13, 2023

(54) FABRICATION PROCESS OF VERTICAL-CHANNEL, SILICON, FIELD-EFFECT TRANSISTORS

(71) Applicant: OmniVision Technologies, Inc., Santa Clara, CA (US)

(72) Inventors: Yuanliang Liu, San Jose, CA (US); Hui Zang, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 164 days.

(21) Appl. No.: 17/126,584

(22) Filed: Dec. 18, 2020

(65) Prior Publication Data

US 2022/0199665 A1 Jun. 23, 2022

(51) Int. Cl.
| | |
|---|---|
| H01L 29/66 | (2006.01) |
| H01L 21/02 | (2006.01) |
| H01L 21/311 | (2006.01) |
| H01L 27/146 | (2006.01) |
| H01L 21/308 | (2006.01) |
| H01L 29/423 | (2006.01) |

(52) U.S. Cl.
CPC .. *H01L 29/66613* (2013.01); *H01L 21/02233* (2013.01); *H01L 21/02271* (2013.01); *H01L 21/308* (2013.01); *H01L 21/31144* (2013.01); *H01L 27/14614* (2013.01); *H01L 27/14643* (2013.01); *H01L 27/14689* (2013.01); *H01L 29/4236* (2013.01)

(58) Field of Classification Search
None
See application file for complete search history.

(56) References Cited

U.S. PATENT DOCUMENTS

| | | | | |
|---|---|---|---|---|
| 2013/0175548 | A1* | 7/2013 | Kudou | H01L 21/049 257/77 |
| 2013/0292698 | A1* | 11/2013 | Then | H01L 21/30612 438/270 |
| 2013/0320435 | A1* | 12/2013 | Ng | H01L 29/66734 438/270 |
| 2015/0072493 | A1* | 3/2015 | Chan | H01L 29/7813 438/270 |
| 2015/0340464 | A1* | 11/2015 | Tang | H01L 29/66545 438/156 |

(Continued)

*Primary Examiner* — Scott B Geyer
(74) *Attorney, Agent, or Firm* — Cozen O'Connor

(57) ABSTRACT

A method of fabricating transistors with a vertical gate in trenches includes lithographing to form wide trenches; forming dielectric in the trenches and filling the trenches with flowable material; and lithography to form narrow trenches within the wide trenches thereby exposing well or substrate before epitaxially growing semiconductor strips atop substrate exposed by the narrow trenches; removing the flowable material; growing gate oxide on the semiconductor strip; forming gate conductor over the gate oxide and into gaps between the epitaxially-grown semiconductor strips and the dielectric; masking and etching the gate conductor; and implanting source and drain regions. The transistors formed have semiconductor strips extending from a source region to a drain region, the semiconductor strips within trenches, the trench walls insulated with a dielectric, a gate oxide formed on both vertical walls of the semiconductor strip; and gate material between the dielectric and gate oxide.

8 Claims, 6 Drawing Sheets

(56) References Cited

U.S. PATENT DOCUMENTS

| 2017/0062586 | A1* | 3/2017 | Mao | ................... | H01L 29/7827 |
| 2017/0287774 | A1* | 10/2017 | Abe | ..................... | H01L 21/743 |
| 2021/0087691 | A1* | 3/2021 | Azumo | .................. | C23C 16/56 |
| 2022/0199665 | A1* | 6/2022 | Liu | ................... | H01L 29/66613 |

* cited by examiner

US 11,677,011 B2

FABRICATION PROCESS OF VERTICAL-CHANNEL, SILICON, FIELD-EFFECT TRANSISTORS

FIELD

A new fabrication process is presented for small vertical-channel insulated-gate field-effect transistors. In an embodiment, these transistors are used as source-follower and reset transistors in buried-photodiode image sensor circuits to achieve small cell size and minimize pixel area.

BACKGROUND

Silicon field-effect transistors with non-coplanar source/drain diffusions, typically having one of their source and drain regions above the other, are commonly used in high-power switching devices, and have also been used as selection transistors to couple buried photodiodes to overlying circuitry. These devices, however, do not use a vertical channel to couple between coplanar but horizontally-separated source/drain diffusions.

SUMMARY

In an embodiment, a method of fabricating a transistor with a vertical gate in a wide trench includes masking and etching the wide trench; forming a dielectric in and around the wide trench; depositing a flowable material into the wide trench; masking and etching to form an inner, narrow, trench within the wide trench and thereby exposing well or substrate. The method continues with epitaxially growing a semiconductor strip seeded by the well or substrate within the inner, narrow, trench; removing the flowable material from the wide trench; growing a gate oxide on the semiconductor strip; forming a gate conductor over the gate oxide and into gaps between the epitaxially-grown semiconductor strips and the dielectric; masking and etching the gate conductor; and implanting source and drain regions.

In another embodiment, a vertical-gate transistor includes a semiconductor strip of a first conductive type extending from a source region of a second conductive type to a drain region of the second conductive type, the semiconductor strip formed within a trench, the trench walls being insulated with a dielectric; a gate oxide formed on both vertical walls of the semiconductor strip; and a gate material between the dielectric and the gate oxide.

DETAILED DESCRIPTION OF THE EMBODIMENTS

Figure 1:
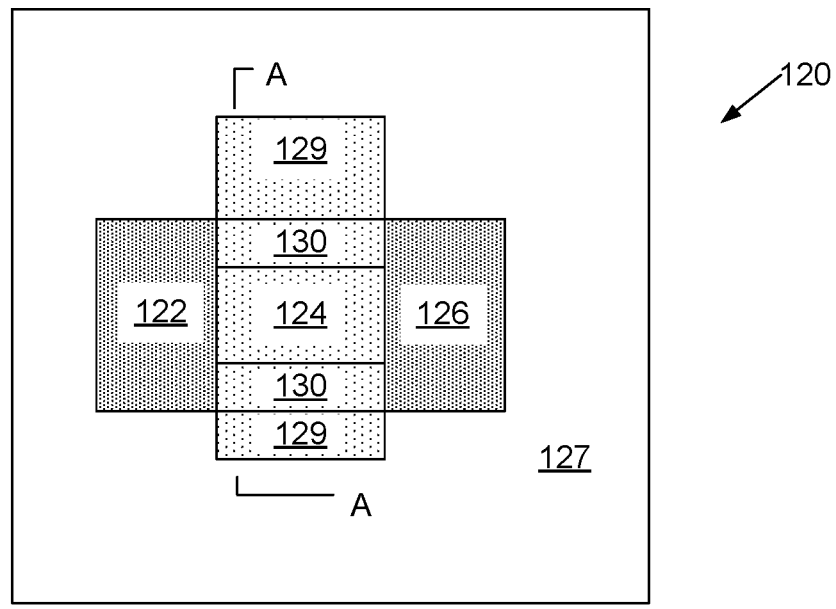
FIG. 1 is a top plan view of a transistor configured for vertical channels between coplanar source/drain regions.

A new transistor 120 having an epitaxial semiconductor strip in a trench is illustrated in top plan view in FIG. 1. The transistor has source 122 and drain 126 diffused regions of a first diffusion type, such as N-type, in a well or substrate 127 of a second diffusion type, such as P-type, semiconductor such as silicon. In alternative embodiments the semiconductor is another group IV material such as germanium, a compound semiconductor such as an alloy of silicon with carbon or germanium, or a III-V semiconductor such as gallium arsenide, gallium indium arsenide. The transistor 120 has a gate formed of a conductor such as polysilicon directly over a semiconductor strip or fill 124 of the second diffusion type, extending to gate including first and second sides 130 of the semiconductor strip or fill 124, and the gate conductor may overlap the transistor in an overlap region 128. The gate conductor material may be extended 129 over other portions of the device to serve as interconnect In cross section, the new transistor 100 is fabricated within and on top of a trench 102 cut into the well or substrate 104, 127 of the second conductor type. Approximately centrally located within the trench 102 is an epitaxially-grown semiconductor strip 106 having along its lateral sides a thin gate insulator 108. Gate conductor 110 is formed over semiconductor strip 106 and fills a vertical-gate portion 112 of trench 102 on both lateral sides of semiconductor strip 106. Remaining portions of trench 102 are filled with a thick dielectric 114 that also extends across well or substrate surface under overlap portions 116 and interconnect portions 118 of gate conductor 110.

In a particular embodiment, the well or substrate 104, 127 is P-type silicon, semiconductor fill 124 is epitaxially-grown P-type silicon, the gate insulator 108 is a thermally-grown silicon oxide, the gate conductor material 130, 110 is polysilicon, and inversion regions that form when the gate conductor material 130, 110 is biased appropriately are N-type, and the transistor with epitaxial strip 124, 106 operates as an N-channel metal-oxide-semiconductor (MOS) transistor. In this embodiment, thick dielectric 114 is a silicon oxide such as a thermally-grown oxide or a CVD oxide film, although other dielectrics may be used.

When gate conductor 110 is appropriately biased, inversion regions form along both top and sidewalls of the epitaxially-grown semiconductor strip 106, 124, thus operating with an effective gate width of the sum of twice a depth of trench 102 plus a width of semiconductor strip 106, 124.

The transistor 102 with epitaxial semiconductor strip in a trench has advantage over prior MOS transistors in that effective gate width of the transistor may be greater than that of a conventionally-fabricated planar transistor fabricated using the same surface area of a semiconductor wafer.

Figure 3:
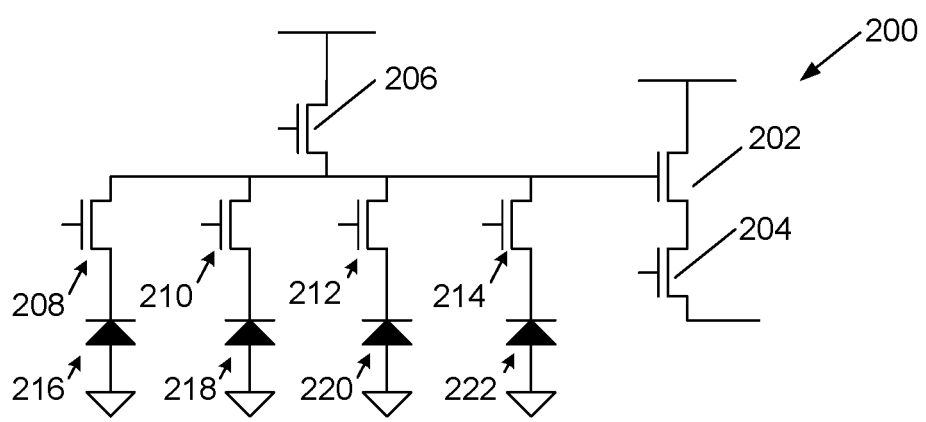
FIG. 3 is a schematic diagram of a four-buried-photodiode, seven-transistor pixel cell useful in image sensor integrated circuits.

In an embodiment, the transistor 100 with epitaxial strip 106 is used in an image sensor integrated circuit as a reduced-physical-width source-follower transistor 202 (FIG. 3), cell-selection transistor 204, and reset transistor 206 in a 4-buried-photodiode pixel cell 200 of an image sensor. In this image sensor pixel cell, photodiode transmission gate transistors 208, 210, 212, 214 may be vertical transistors for selecting buried photodiodes 216, 218, 220, 222.

Figure 2:
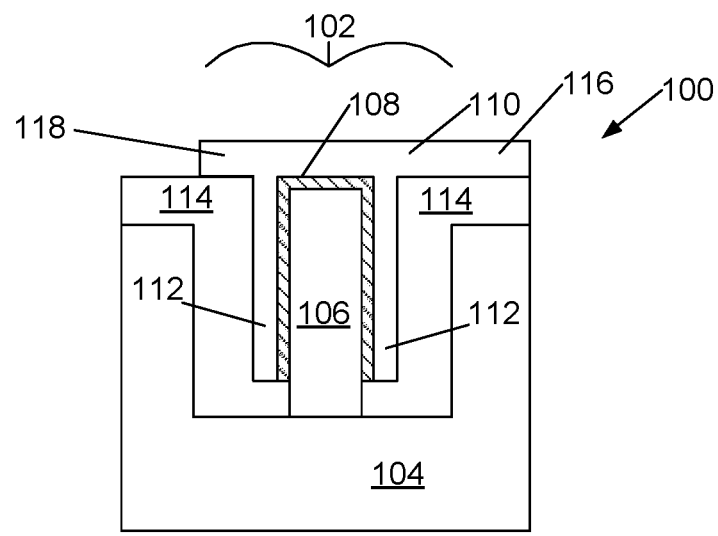
FIG. 2 is a cross sectional diagram of a transistor configured for vertical channels along sidewalls of an epitaxial semiconductor strip in a trench, taken along the line A-A of FIG. 1.
Figure 4:
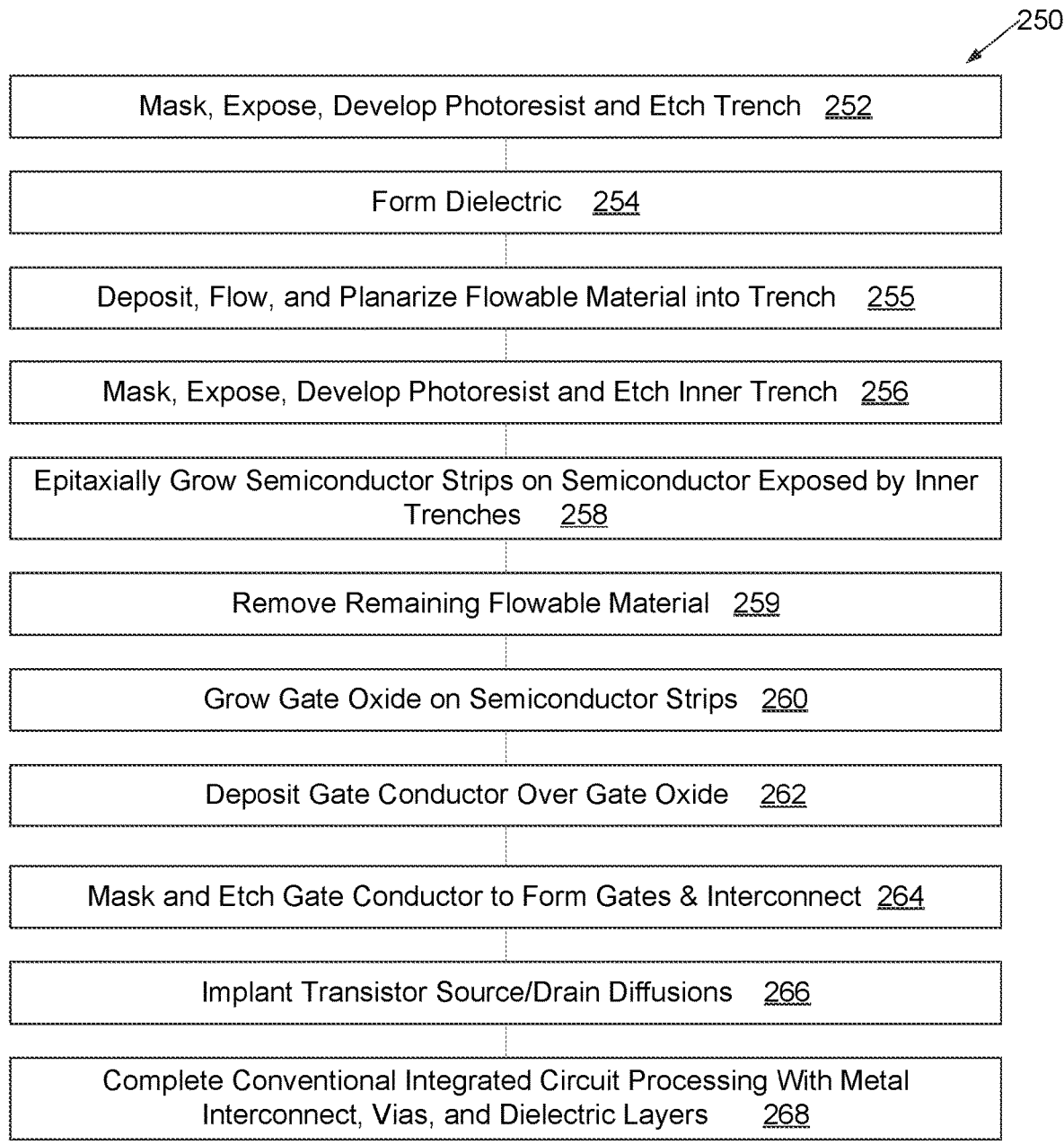
FIG. 4 is a flowchart of a method of fabricating the transistor of FIGS. 1 and 2.

In an embodiment, the transistor 100 with epitaxial strip of FIGS. 1 and 2 is fabricated according to the method 250 of FIG. 4; note that earlier steps in processing are required to prepare the wafer prior to the steps of method 250, intervening steps such as cleaning and photoresist stripping may be performed in addition to the steps described herein, and following steps are required to complete the integrated circuit.

Figure 5:
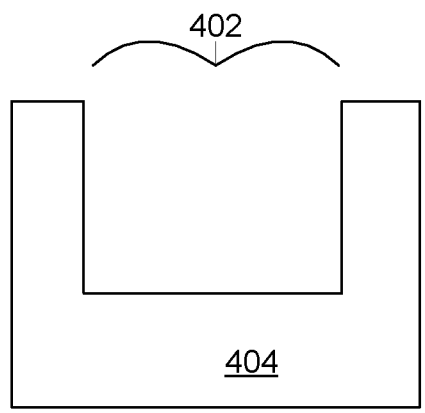
FIGS. 5, 6, 7, 8, 9, 10, 11, 12, and 13 are cross sectional diagrams illustrating a partially-fabricated transistor of FIGS. 1 and 2 as each may appear at a particular step of the method of FIG. 4.

A masking and etching operation 252 is performed to etch trenches 402 (FIG. 5) of depth 50 to 400 nanometers into well or substrate 404. Masking and etching operations as described herein may include deposition and removal of hard mask materials such as silicon nitride SiN in addition to deposition of photomask material, exposure of the photomask material, development of the photoresist material, etching, and removal of the photoresist. Replanarization operations, such as chemical-mechanical polishing, may also be interspersed between steps documented in FIG. 4.

Figure 6:
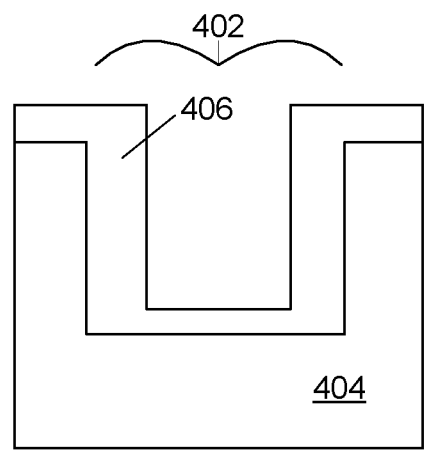

After etching trench 402, 102 the trench 402, 102 is then lined with a dielectric formed 406 (FIG. 6) in and around the trench 402. In embodiments, this dielectric is a thermal oxide grown on the semiconductor well or substrate surrounding the trench.

Figure 7:
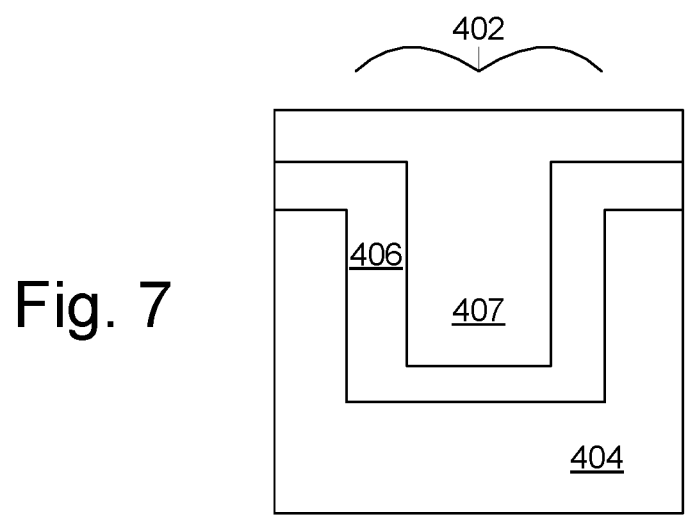
Figure 8:
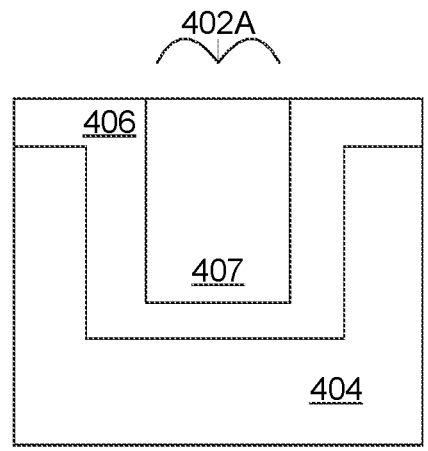

After forming dielectric 254, a flowable CVD material 407 (FIG. 7) is deposited and flowed 255. After flowing this oxide, the flowable CVD material may be planarized (FIG. 8) to level the wafer surface leaving flowable CVD material 407 in the space 402A within each trench not occupied by dielectric 406. In an embodiment, flowable CVD material 407 is a silicon nitride or a film containing silicon, nitrogen, and hydrogen.

Figure 9:
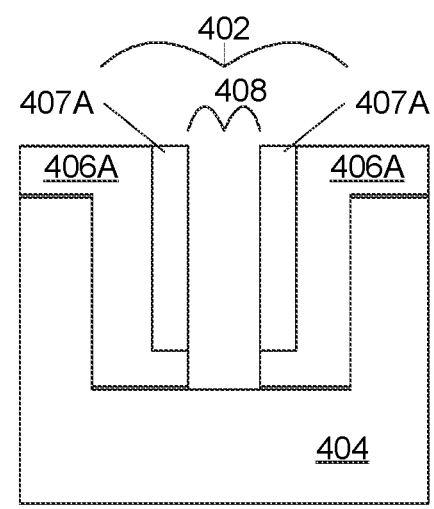
Figure 10:
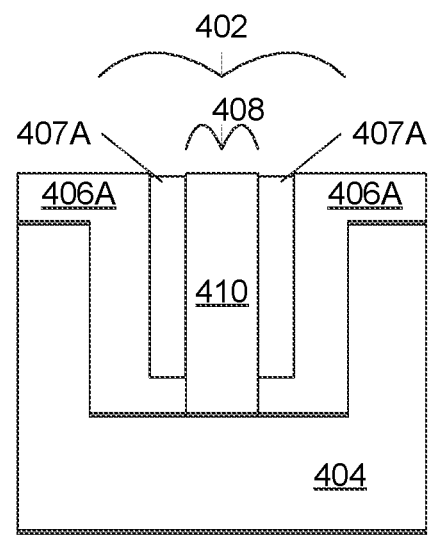
Figure 11:
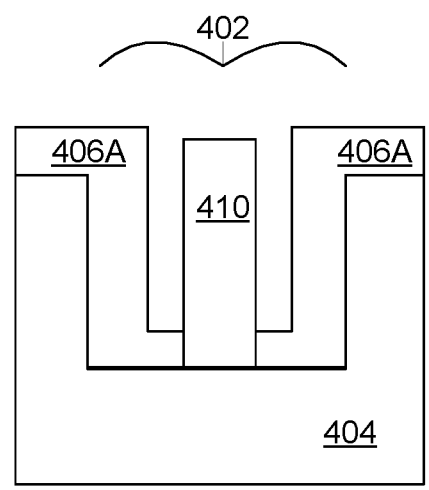
Figure 12:
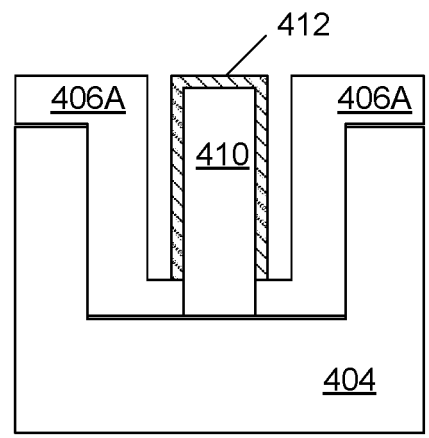

Once dielectric 406 and flowable CVD material 407 is formed, a masking and etching operation 256 is performed to form an inner, narrow, trench 408 (FIG. 9), in dielectric 406 and flowable CVD material 407, forming shapes 406A (FIG. 9) of remaining dielectric and 407A of remaining flowable CVD material and exposing substrate or well 404 at the base of narrow trench 408. After inner trench 408 has been formed, a semiconductor strip 410 (FIG. 10) on the bottom of inner trench 408 and aligned centrally within trench 402 is formed by epitaxial growth 258 seeded by well or substrate 404. After the semiconductor strip 410 is grown, the device being formed may optionally be replanarized before remaining flowable material 407 is removed 259 (FIG. 11) and gate oxide 412 (FIG. 12) is grown 260 on semiconductor strip 410.

Figure 13:
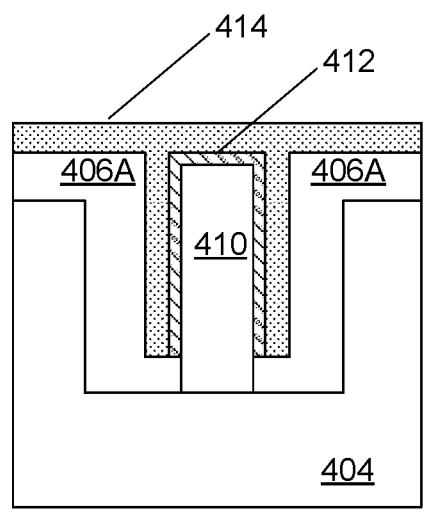

After gate oxide 412 is grown 260, gate conductor 414 (FIG. 13), which in an embodiment is polysilicon silicided with molybdenum, is deposited 262 over the gate oxide 412 and into gaps between the epitaxially-grown semiconductor strips 410 and dielectric 406A.

After depositing 262 the gate conductor 414, the gate conductor is masked and etched 264 to pattern this conductor with gate regions 130, 124 (FIG. 1), overlap regions (if any) 128, and extended interconnect regions 129 as required for the particular integrated circuit design.

After the gate conductor 414 is masked and etched 264, the source and drain regions 122, 126 are implanted 266, after which the integrated circuit is completed 268 with conventional metal, via, and contact deposition, masking, and etching steps.

In embodiments, hundreds of thousands or millions of the lateral vertical-gate transistors herein described are formed on each wafer, one or more per pixel cell of a multi-megapixel image sensor.

Combinations

A method of fabricating a transistor designated A with a vertical gate in a wide trench includes masking and etching the wide trench; forming a dielectric in and around the wide trench; filling the wide trench with a flowable material; masking and etching to form an inner, narrow, trench within the wide trench and thereby exposing well or substrate. The method continues with epitaxially growing a semiconductor strip seeded by the well or substrate atop well or substrate exposed by the inner, narrow, trench; removing the flowable material from the wide trench; growing a gate oxide on the semiconductor strip; forming a gate conductor over the gate oxide and into gaps between the epitaxially-grown semiconductor strips and the dielectric; masking and etching the gate conductor; and implanting source and drain regions.

A method designated AA including the method designated A wherein the wide trench is of depth 50 to 400 nanometers.

A method designated AB including the method designated A, or AA wherein the semiconductor strip comprises primarily silicon.

A method designated AC including the method designated A, AA, or AB wherein the well or substrate comprises primarily silicon.

A method designated AD including the method designated A, AA, AB, or AC wherein the gate conductor comprises primarily polysilicon.

A method designated AE including the method designated A, AA, AB, AC, or AD wherein the dielectric comprises silicon dioxide.

A method designated AF including the method designated A, AA, AB, AC, AD, or AE wherein the semiconductor strip is of P-type silicon and the source and drain are of N-type silicon.

A method designated AG including the method designated A, AA, AB, AC, AD, AE, or AF wherein the flowable material comprises silicon nitrogen and hydrogen.

A vertical-gate transistor designated B includes a semiconductor strip of a first conductive type extending from a source region of a second conductive type to a drain region of the second conductive type, the semiconductor strip formed within a trench, the trench walls being insulated with a dielectric; a gate oxide formed on both vertical walls of the semiconductor strip; and a gate material between the dielectric and the gate oxide.

A vertical-gate transistor designated BA including the vertical-gate transistor designated B wherein the semiconductor strip comprises primarily silicon.

A vertical-gate transistor designated BB including the vertical-gate transistor designated B or BA wherein the gate material comprises primarily polysilicon.

A vertical-gate transistor designated BC including the vertical-gate transistor designated B, BA, or BC wherein the trench has depth between 50 and 400 nanometers.

While the invention has been particularly shown and described with reference to a preferred embodiment thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow.

What is claimed is:

1. A method of fabricating a transistor with a vertical gate in a wide trench comprising:
    masking and etching to form the wide trench;
    forming a liner dielectric in and around the wide trench;
    filling the wide trench with a first flowable material;
    masking and etching to form an inner, narrow, trench in the wide trench, thereby exposing a well or substrate;

epitaxially growing a semiconductor strip seeded by the well or substrate atop the well or substrate exposed by the inner, narrow, trench;

removing the first flowable material from the wide trench;

growing a gate oxide on the epitaxially-grown semiconductor strip;

forming a gate conductor over the gate oxide and into gaps between the epitaxially-grown semiconductor strips and the liner dielectric;

masking and etching the gate conductor; and implanting source and drain regions.

2. The method of claim 1 wherein the wide trench has a depth of 50 to 400 nanometers.

3. The method of claim 2 wherein the semiconductor strip comprises primarily silicon.

4. The method of claim 3 wherein the gate conductor comprises primarily polysilicon.

5. The method of claim 4 wherein the liner dielectric comprises a second flowable material consisting of a chemical-vapor-deposition (CVD) oxide.

6. The method of claim 5 wherein the semiconductor strip is P-type silicon and the source and drain are N-type silicon.

7. The method of claim 5 wherein the first flowable material comprises silicon, nitrogen, and hydrogen.

8. The method of claim 2 wherein the well or substrate comprises primarily silicon.

\* \* \* \* \*